United States Patent
West et al.

(10) Patent No.: US 6,679,621 B2
(45) Date of Patent: Jan. 20, 2004

(54) SIDE EMITTING LED AND LENS

(75) Inventors: Robert S. West, Wixom, MI (US);
Gary D. Sasser, San Jose, CA (US);
James W. Stewart, San Jose, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/179,600

(22) Filed: Jun. 24, 2002

(65) Prior Publication Data

US 2003/0235050 A1 Dec. 25, 2003

(51) Int. Cl.[7] .............................................. F21V 5/00
(52) U.S. Cl. ....................... 362/327; 362/308; 362/337
(58) Field of Search ................................. 362/308, 309, 362/327, 332, 336, 337, 338, 340; 313/512

(56) References Cited

U.S. PATENT DOCUMENTS

| | | | | |
|---|---|---|---|---|
| 1,384,659 A | * | 7/1921 | Benard | 362/309 |
| 1,990,390 A | * | 2/1935 | Rudy, Jr. | 362/337 |
| 2,344,221 A | * | 3/1944 | Trautner | 362/309 |
| 3,646,338 A | * | 2/1972 | Goytisolo | 362/309 |
| 3,739,169 A | * | 6/1973 | Weinreich | 362/542 |
| 4,192,994 A | | 3/1980 | Kastner | 250/280 |
| 4,371,916 A | * | 2/1983 | De Martino | 362/332 |
| 4,698,730 A | | 10/1987 | Sakai et al. | 362/311 |
| 5,140,220 A | | 8/1992 | Hasegawa | 313/512 |
| 5,335,157 A | * | 8/1994 | Lyons | 362/337 |
| 5,404,282 A | | 4/1995 | Klinke et al. | 362/249 |
| 5,452,190 A | | 9/1995 | Priesemuth | 362/255 |
| 5,608,290 A | | 3/1997 | Hutchisson et al. | 315/200 |
| 5,777,433 A | | 7/1998 | Lester et al. | 313/512 |
| 5,806,955 A | | 9/1998 | Parkyn, Jr. et al. | 362/31 |
| 5,894,195 A | | 4/1999 | McDermott | 313/512 |
| 5,894,196 A | | 4/1999 | McDermott | 313/512 |
| 5,897,201 A | * | 4/1999 | Simon | 362/327 |
| 5,898,267 A | | 4/1999 | McDermott | 313/512 |
| 6,030,099 A | | 2/2000 | McDermott | 362/800 |
| 6,048,083 A | | 4/2000 | McDermott | 362/337 |
| 6,177,761 B1 | | 1/2001 | Pelka et al. | 313/512 |

FOREIGN PATENT DOCUMENTS

| | | |
|---|---|---|
| WO | WO 98/26212 | 6/1998 |
| WO | WO 99/09349 | 2/1999 |
| WO | WO 01/07828 A1 | 2/2001 |

OTHER PUBLICATIONS

Patent Application, 09/849,042, Side Emitting LED, West, et al., filed May 4, 2001, US Publication 20020163810.
Patent Application, 09/849,084, LED Lens, West, et al., filed May 4, 2001, US Publication 20020163808.
Parkyn et al., The Black Hole™: Cuspated waveguide–injectors and illuminators for LEDs; Part of the SPIE Conference on Nonimaging Optics: Maximum Efficiency Light Transfer V, Denver, CO, Jul. 1999.

* cited by examiner

*Primary Examiner*—Alan Cariaso
(74) *Attorney, Agent, or Firm*—Patent Law Group LLP

(57) ABSTRACT

A lens comprises a bottom surface, a reflecting surface, a first refracting surface obliquely angled with respect to a central axis of the lens, and a second refracting surface extending as a smooth curve from the bottom surface to the first refracting surface. Light entering the lens through the bottom surface and directly incident on the reflecting surface is reflected from the reflecting surface to the first refracting surface and refracted by the first refracting surface to exit the lens in a direction substantially perpendicular to the central axis of the lens. Light entering the lens through the bottom surface and directly incident on the second refracting surface is refracted by the second refracting surface to exit the lens in a direction substantially perpendicular to the central axis of the lens. The lens may be advantageously employed with LEDs, for example, to provide side-emitting light-emitting devices. A lens cap attachable to a lens is also provided.

15 Claims, 16 Drawing Sheets

SIDE EMITTING LED AND LENS

CROSS-REFERENCE TO RELATED APPLICATIONS

This invention is related to U.S. patent application Ser. No. 09/849,042 filed May 4, 2001, entitled "Side Emitting LED," and to U.S. patent application Ser. No. 09/849,084 filed May 4, 2001, entitled "LED Lens". Both of these applications are assigned to the assignee of the present invention and incorporated herein by reference in their entirety.

FIELD OF THE INVENTION

This invention relates generally to light emitting devices and more particularly to side emitting light emitting diodes (LEDs).

BACKGROUND

FIG. 1A illustrates a conventional LED package 10. LED package 10 has a hemispherical lens 12 of a type well-known in the art. Package 10 may also have a reflector cup (not shown), in which an LED chip (not shown) resides, that reflects light emitted from the bottom and sides of the LED chip toward the observer. In other packages, other types of reflectors reflect the LED chip's emitted light in a particular direction.

Lens 12 creates a field of illumination 14 roughly along a longitudinal package axis 16 of LED package 10. The vast majority of light emitted from an LED package 10 with a hemispherical lens 12 is emitted upwards away from LED package 10 with only a small portion emitted out from the sides of LED package 10.

FIG. 1B illustrates a known light emitting diode (LED) package 30 with a longitudinal package axis 26. LED package 30 includes an LED chip 38, a lens 32 with straight vertical sidewall 35 and a funnel-shaped top surface 37. There are two main paths in which the light will travel through package 30. The first light path P1 is desirable with the light emitted from chip 38 and traveling to surface 37 where total internal reflection (TIR) causes the light to exit through sidewall 35 at approximately 90 degrees to the longitudinal axis. The second light path P2 is light emitted from chip 38 towards sidewall 35 at an angle causing TIR or a reflection from sidewall 35 causing the light to exit package 30 at an angle not close to perpendicular to the longitudinal axis. This path is not desirable and limits the efficiency of side extracted light.

FIG. 2 illustrates the conventional LED package 10 of FIG. 1 coupled along an edge of a portion of a refractive light guide 20. LED package 10 is positioned on the edge of light guide 20 along the width of light guide 20. Light rays R1, R2, R3 emitted by LED package 10 are propagated along the length of light guide 20. FIG. 3 illustrates a plurality of conventional LED packages 10 positioned along the width of light guide 20 of FIG. 2. These conventional LED/light guide combinations are inefficient as they require a large number of LED packages 10 to illuminate the light guide and result in coupling inefficiencies due to relatively small acceptance angles. These conventional LED packages 10 must be arranged along the entire length of one side of light guide 20 to fully illuminate light guide 20.

A need exists for an LED package to couple efficiently to shallow reflectors and thin light guides. A need also exists for an LED package to allow these secondary optical elements to have relatively large illuminated areas.

SUMMARY

In accordance with one embodiment, a lens comprises a bottom surface, a reflecting surface, a first refracting surface obliquely angled with respect to a central axis of the lens, and a second refracting surface extending as a smooth curve from the bottom surface to the first refracting surface. Light entering the lens through the bottom surface and directly incident on the reflecting surface is reflected from the reflecting surface to the first refracting surface and refracted by the first refracting surface to exit the lens in a direction substantially perpendicular to the central axis of the lens. Light entering the lens through the bottom surface and directly incident on the second refracting surface is refracted by the second refracting surface to exit the lens in a direction substantially perpendicular to the central axis of the lens.

The inventive lens may be advantageously employed to provide side-emitting light-emitting devices that may be used with light guides and reflectors that have very thin profiles and/or large illuminated areas.

In accordance with another embodiment, a light-emitting device comprises a light-emitting semiconductor device and a lens. The lens comprises a bottom surface, a reflecting surface, a first refracting surface obliquely angled with respect to a central axis of the lens, and a second refracting surface extending as a smooth curve from the bottom surface to the first refracting surface. Light emitted by the semiconductor device, entering the lens through the bottom surface, and directly incident on the reflecting surface is reflected from the reflecting surface to the first refracting surface and refracted by the first refracting surface to exit the lens in a direction substantially perpendicular to the central axis of the lens. Light emitted by the semiconductor device, entering the lens through the bottom surface, and directly incident on the second refracting surface is refracted by the second refracting surface to exit the lens in a direction substantially perpendicular to the central axis of the lens.

The inventive light-emitting device may be efficiently coupled to shallow reflectors and to thin light guides. Secondary optics employed with the inventive light-emitting device may have relatively large illuminated areas.

In accordance with another embodiment, a lens cap comprises a bottom surface attachable to a lens, a reflecting surface, a first refracting surface obliquely angled with respect to a central axis of the lens cap, and a second refracting surface extending as a smooth curve from the bottom surface to the first refracting surface. Light entering the lens cap through the bottom surface and directly incident on the reflecting surface is reflected from the reflecting surface to the first refracting surface and refracted by the first refracting surface to exit the lens cap in a direction substantially perpendicular to the central axis of the lens. Light entering the lens cap through the bottom surface and directly incident on the second refracting surface is refracted by the second refracting surface to exit the lens cap in a direction substantially perpendicular to the central axis of the lens cap. The inventive lens cap may provide advantages similar to or the same as those described above.

BRIEF DESCRIPTION OF THE DRAWINGS

Use of the same reference symbols in different figures indicates similar or identical items. It should be noted that the dimensions in the figures are not necessarily to scale.

DETAILED DESCRIPTION

Figure 1A:
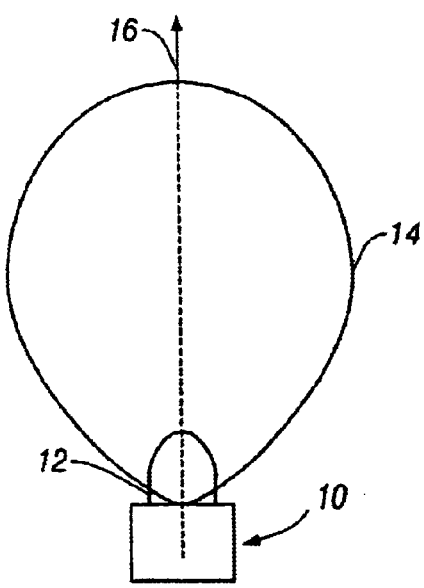
FIG. 1A illustrates a conventional LED package.
Figure 1B:
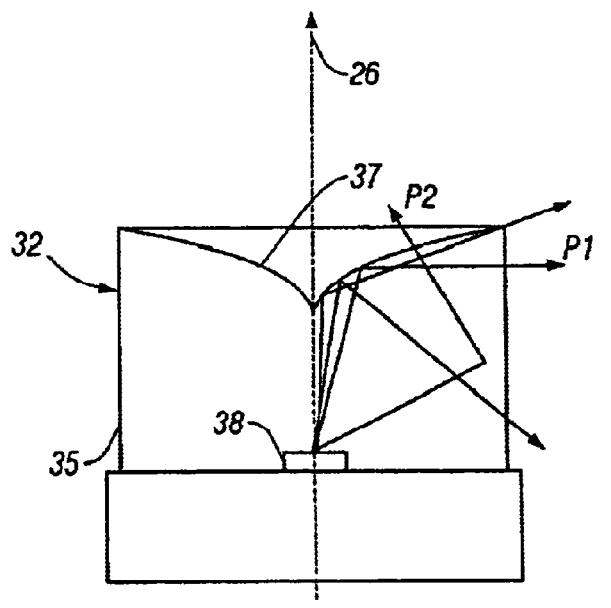
FIG. 1B illustrates another conventional LED package.
Figure 2:
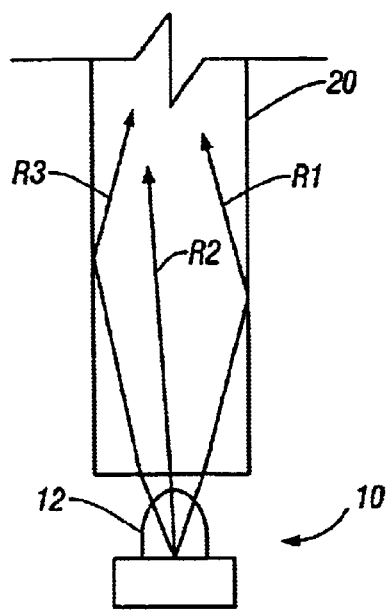
FIG. 2 illustrates a cross-sectional view of a conventional edge-illuminated light guide.
Figure 3:
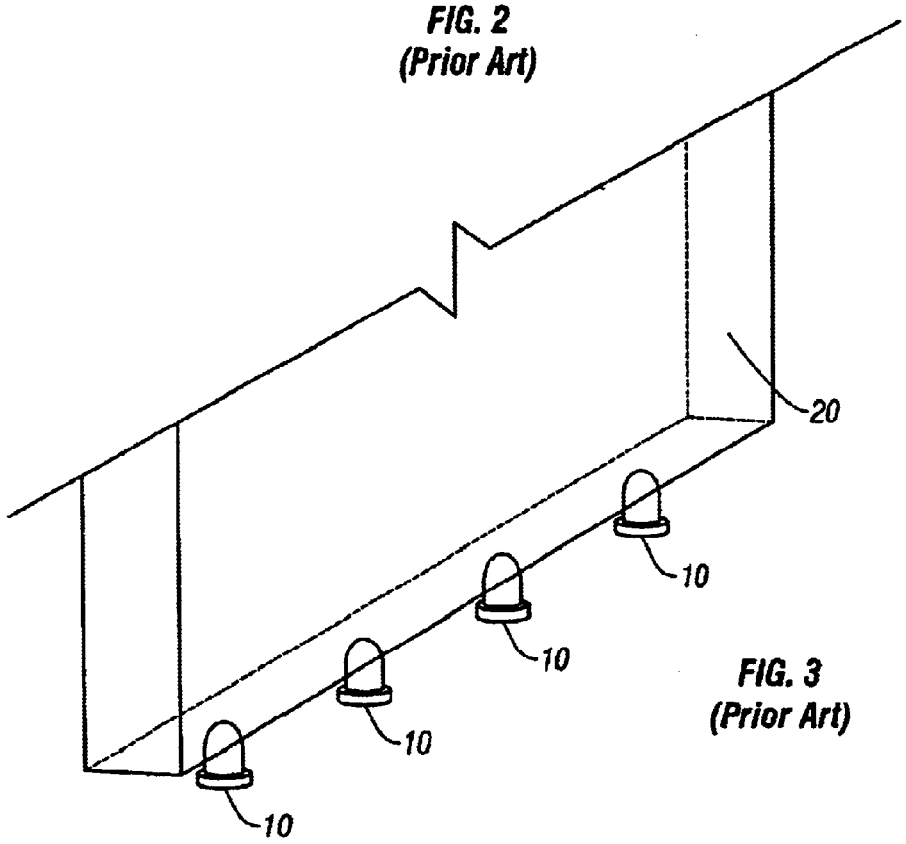
FIG. 3 illustrates a perspective view of the light guide of FIG. 2.
Figure 4:
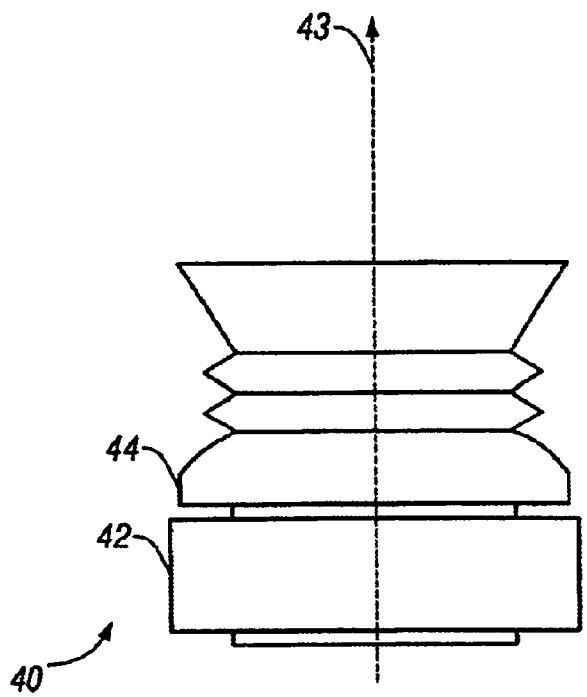
FIG. 4 illustrates one embodiment of the invention.
Figure 5A:
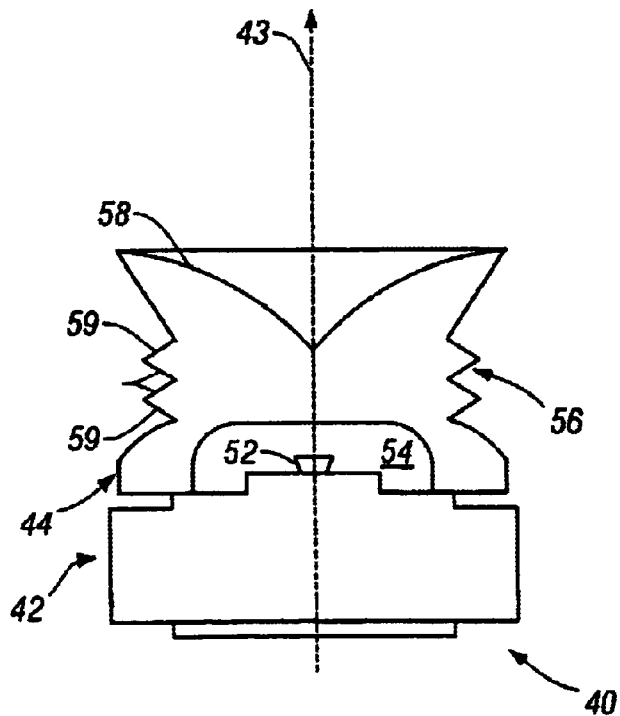
FIG. 5A illustrates a cross-sectional view of the LED package of FIG. 4.

FIG. 4 illustrates an example of a side emitting LED package 40 in accordance with one embodiment of the invention. LED package 40 includes a longitudinal package axis 43, an LED package base 42 and a lens 44. Lens 44 is coupled to LED package base 42. Longitudinal package axis 43 passes through the center of LED package base 43 and lens 44. As seen in FIG. 5A, a surface of LED package base 42 supports an LED chip 52 (a semiconductor chip having a light emitting pn junction) for generating light. LED chip 52 may be one of any number of shapes, including but not limited to a truncated inverted pyramid (TIP) (shown), cube, rectangular solid, or hemisphere. LED chip 52 includes a bottom surface that may be in contact with, or coated with, a reflective material. Although LED chip 52 may emit light from all of its sides, base 42 is generally configured to reflect emitted light upwards towards lens 44 along the longitudinal axis of the package. Such bases are conventional and may include a parabolic reflector in which LED chip 52 resides on a surface of package base 42. One such package is shown in U.S. Pat. No. 4,920,404, assigned to the present assignee and incorporated herein by reference.

Lens 44 may be manufactured as a separate component using a number of well-known techniques such as diamond turning (i.e., the lens is shaped by a lathe with a diamond-bit), injection molding, and casting. Lens 44 is made of a transparent material, including but not limited to cyclic olefin copolymer (COC), polymethylmethacrolate (PMMA), polycarbonate (PC), PC/PMMA, silicones, fluorocarbon polymers, and polyetherimide (PEI). Lens 44 includes an index of refraction (n) ranging from between about 1.35 to about 1.7, preferably about 1.53, but could have an index of refraction higher or lower based on the material used. In the alternative, lens 44 may be formed onto LED package base 42 and LED chip 52 by various techniques including but not limited to injection molding (e.g., insert molding), and casting.

There is a volume 54 between lens 44 and LED chip 52. Volume 54 may be filled and sealed to prevent contamination of LED 52 using silicone. Volume 54 may also be in a vacuum state, contain air or some other gas, or be filled with an optically transparent material, including but not limited to resin, silicone, epoxy, water or any material with an index of refraction in the range of, for example, about 1.35 to about 1.7 that may be injected to fill volume 54. The material inside volume 54 may be colored to act as a filter in order to allow transmission of all or only a portion of the visible light spectrum. If silicone is used, the silicone may be hard or soft. Lens 44 may also be colored to act as a filter.

Lens 44 includes a refractive portion 56 (which may, but does not necessarily, include one or more sawteeth as shown) and a total internal reflection (TIR) funnel portion 58. The sawtooth portion 56 is designed to refract and bend light so that the light exits from lens 44 as close to 90 degrees to the longitudinal package axis 43 as possible. The sawteeth or refractive surfaces 59 of the sawtooth portion 56 are all light transmissive. Any number of sawteeth 59 may be used within a sawtooth portion of a given length. Lens 44 may be formed as a single piece or, in the alternative, as separate components coupled together.

Funnel portion 58 is designed to have a TIR surface. The TIR surface reflects light such that light exits from lens 44 as close to 90 degrees to a longitudinal package axis 43 of LED package 40 as possible. In one implementation, approximately 33% of the light emitted from LED chip 52 is reflected off the TIR surface of funnel-shaped portion 58 of lens 44. A metallization layer (e.g., aluminum) may be placed on top of funnel portion 58 to prevent light transmission through the TIR surface. A coating or film (e.g., a U.V. inhibitor) may be placed on top of the funnel portion 58 to prevent degradation of the lens as PC degrades in the presence of U.V. light.

The interface between lens 44 and LED package base 42 may also be sealed using any well-known sealant, such as Room Temperature Vulcanizing (RTV) or the like.

Figure 5B:
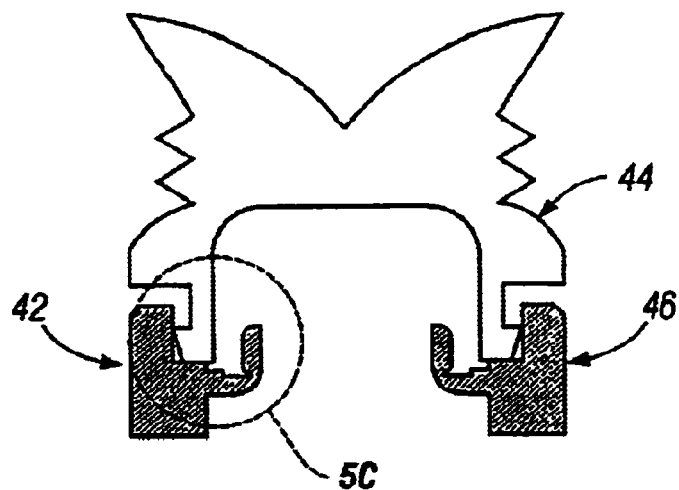
FIG. 5B illustrates a cross-sectional view of the lens mating to the housing of the LED package base.
Figure 5C:
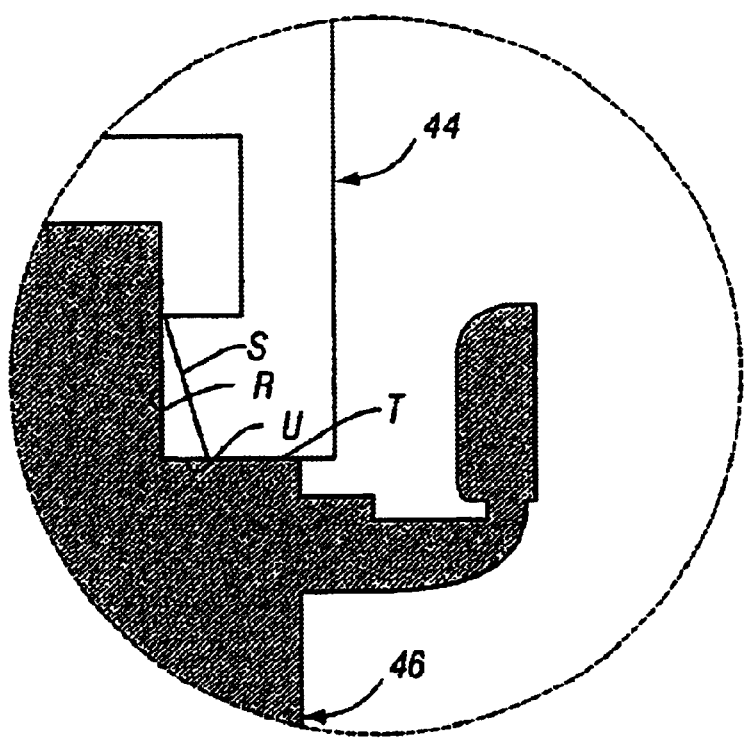
FIG. 5C illustrates a close-up of the lens/housing mating of FIG. 5B.

FIG. 5B illustrates a cross-sectional view of alternative mating of lens 44 to housing 46 of LED package base 42. For clarity, LED chip 52 and other features of base 42 are not shown. Lens 44 may also be attached to LED package base 42 by various attachment methods, including but not limited to snap-fitting, friction-fitting, heat staking, adhesive bonding, and ultra-sonic welding. The features of lens 44, as shown in FIG. 5B, are applicable to lenses that are either formed as a separate component or encapsulated onto LED package base 42. FIG. 5C illustrates a close-up of the lens/housing mating of FIG. 5B. Surface S may snap fit into surface R. Surface S may friction fit tight with surface R. Surface T may be welded to surface U using various methods including, without limitation, plastic welding, sonic welding, and linear welding. Sealing or bonding involves several possible combinations, such as surface S and/or T of lens 44 being sealed/bonded to surface R and/or U of housing 46.

Figure 5D:
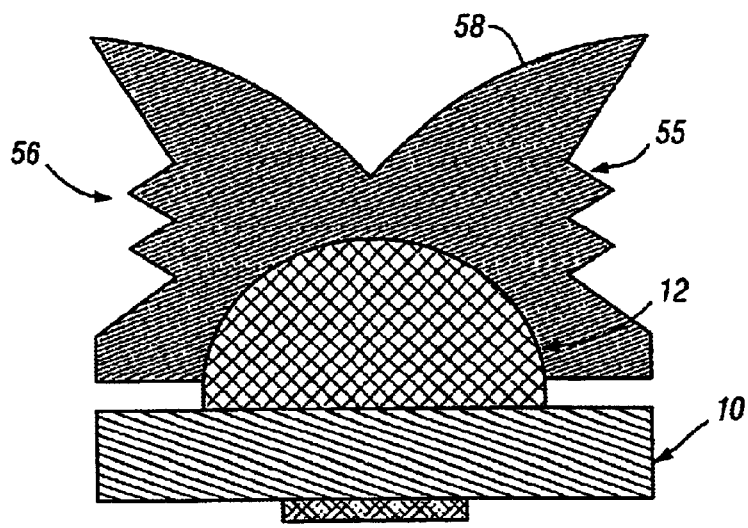
FIG. 5D illustrates a cross-sectional view of a lens cap mating to an LED package.

FIG. 5D illustrates a cross-sectional view of a lens cap 55 mating to a conventional LED package 10 with a hemispherical lens 12. Lens cap 55 may be affixed to lens 12 of LED package 10 by an optical adhesive, for example. Lens cap 55 includes a refractive portion 56 (which may, but does not necessarily, include one or more sawteeth as shown) and reflective funnel portion 58 that may contain the same and/or similar features that operate in the same and/or similar manner, as described above and below, as refractive and TIR portions 56, 58 of lens 44.

Figure 5E:
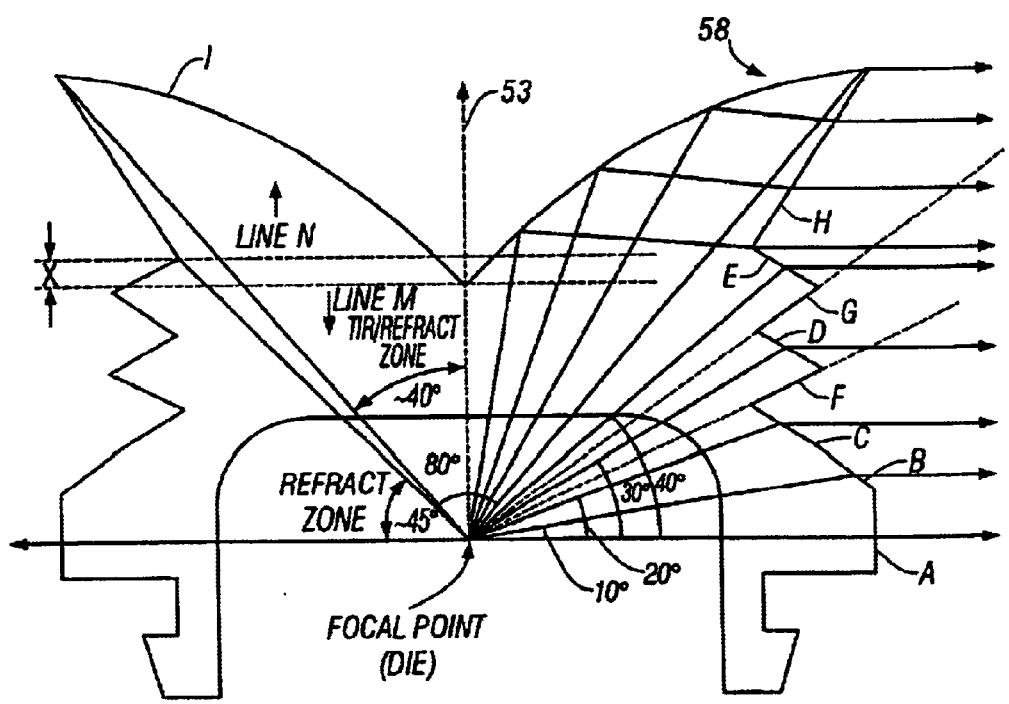
FIG. 5E illustrates ray-traces of one embodiment of a lens.
Figure 5F:
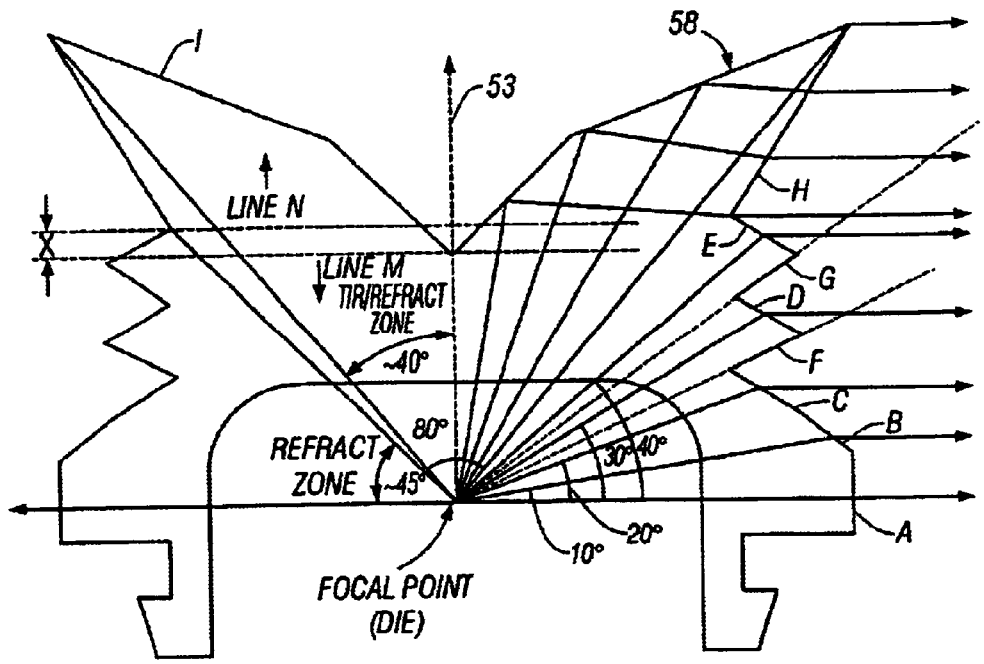
FIG. 5F illustrates ray-traces of another embodiment of a lens.
Figure 5G:
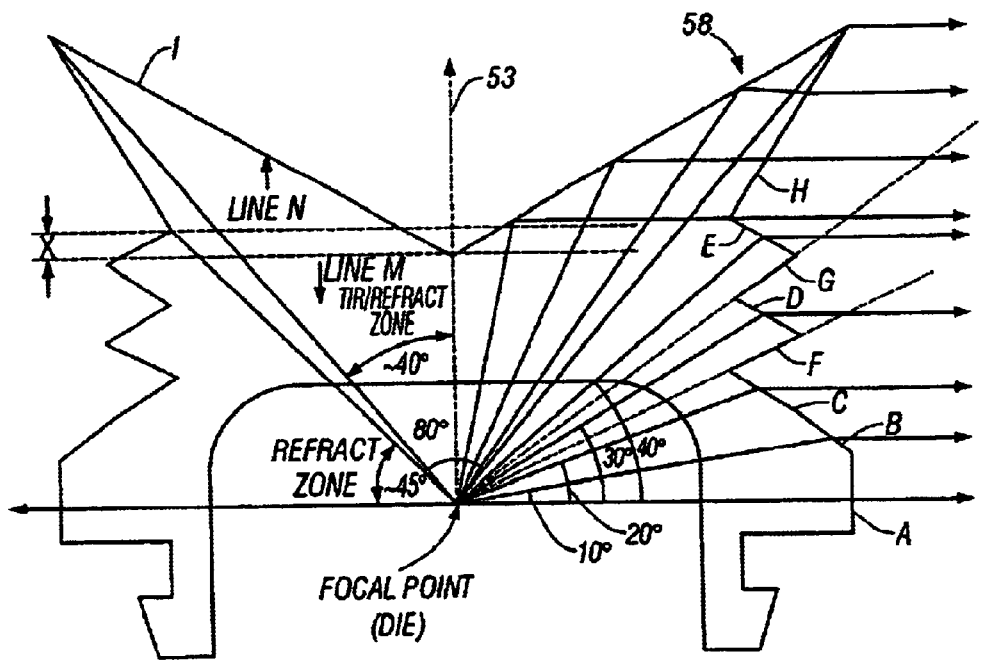
FIG. 5G illustrates ray-traces of a further embodiment of a lens.

FIGS. 5E, 5F and 5G illustrates ray-traces of light through lenses of various curvatures on the top surface of the lens. The features shown in FIGS. 5E–5G are applicable to lenses that are injection molded, cast or otherwise formed. In one implementation, approximately 33% of the light emitted from LED chip 52 (not shown; light is shown emitted from die focal point F) is reflected off the TIR surface I. FIG. 5E illustrates a curved funnel-shaped portion 58 where Surface I is defined from a curve that maintains an angle greater than the critical angle for TIR but directs the light out of the lens roughly at 90 degrees to longitudinal package axis 53. FIG. 5F illustrates a bent-line funnel-shaped portion 58 where Surface I is defined from a line bent into two linear portions, each portion at an angle greater than the critical angle for TIR but directs the light out of the package roughly at 90 degrees to the package axis. FIG. 5G illustrates a linear funnel-shaped portion 58 where Surface I is defined by a straight line at an angle greater than the critical angle for TIR but directs the light out of the package roughly at 90 degrees to the package axis.

In FIGS. 5E–5G, Surface H works with surface I to emit light perpendicular to longitudinal package axis 53. The angle defined by surface I relative to the die is roughly 80 degrees. Surfaces A, B, C, D & E have surface normals such that the incident light ray is refracted out of the lens at approximately 90 degrees to the longitudinal package axis 53. Surfaces F, G & H are approximately parallel to direct incident light rays in order to minimize the amount of direct light transmitted through these surfaces. Surfaces below line N refract light out of the package. Surfaces above line M will direct light out of the lens through a combination of TIR and refraction. Lines's M & N need to be in close proximity of each other to optimize side emission and minimize emission in the longitudinal direction. FIGS. 5E–5G show two zones: zone refraction at approximately 45 degrees or more from longitudinal package axis 53 and zone TIR/refraction at up to approximately 45 degrees from longitudinal package axis 53. For example, in FIGS. 5E–5G, an approximately 40 degree TIR/refraction zone is shown. The interface between the two zones is approximately 45 degrees from the longitudinal package axis 53. A distance X between Line M and Line N is kept at a minimum in order to optimize the side extraction of light from the lens. Line M may equal Line N (i.e., X=0).

Figure 6:
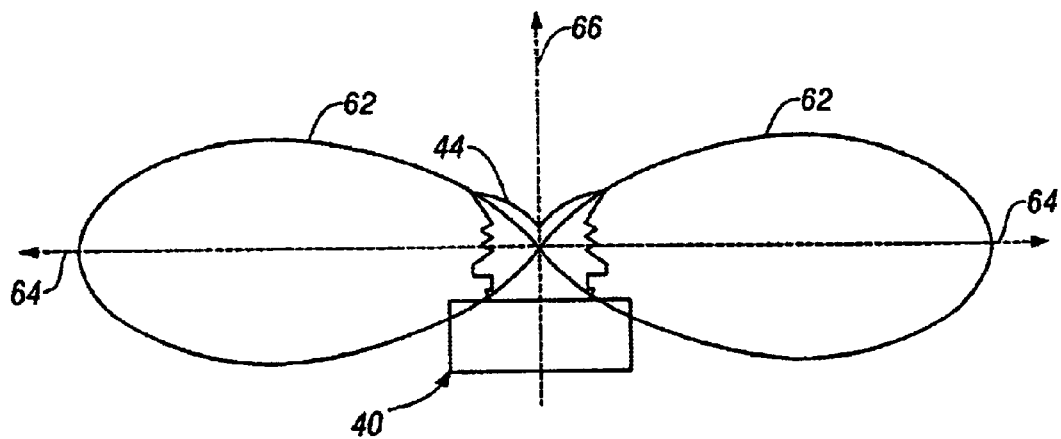
FIG. 6 illustrates side-emission of light from the LED package of FIG. 4.

FIG. 6 illustrates a cross-section of the emission of light from LED package 40 of FIG. 4. Lens 44 of LED package 40 creates a radiation pattern 62 roughly perpendicular to longitudinal package axis 66 of LED package 40. In FIG. 6, this radiation pattern 62 is approximately perpendicular to LED package axis 66 and illustrates relative light intensity and distribution. This field of illumination 62 surrounds LED package 40 and is roughly disk-or toroidal-shaped. Light is emitted from lens 44 approximately parallel to an optical plane 64.

Figure 7A:
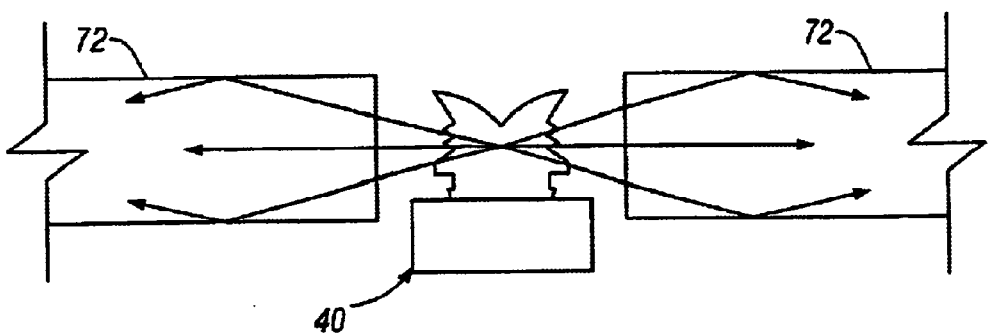
FIG. 7A illustrates a cross-sectional view of the side-emission of light from the LED package of FIG. 4 into two light guides.

The side-emission of light allows even a single LED package 40 to illuminate multiple light guides 72, as seen in FIG. 7A, for example. FIG. 7A. illustrates two planar light guides placed nearly end-to-end with space for at least one LED package 40 between light guides 72. The side-emission of light from the LED package 40 allows light to enter each light guide 72. The LED package 40 may also be inserted into the body of light guide 72. Light guides of various shapes may be used. The sides along the length of the light guides may be planar or taper. For example, a single side emitting LED package 40 may be placed at the center of a disk-shaped light guide (not shown). As light is emitted from the side of LED package 40 over 360 degrees (i.e., in all directions from the center of LED package 40), the light enters the light guide and is refracted and reflected throughout the entire light guide (not shown).

Figure 7B:
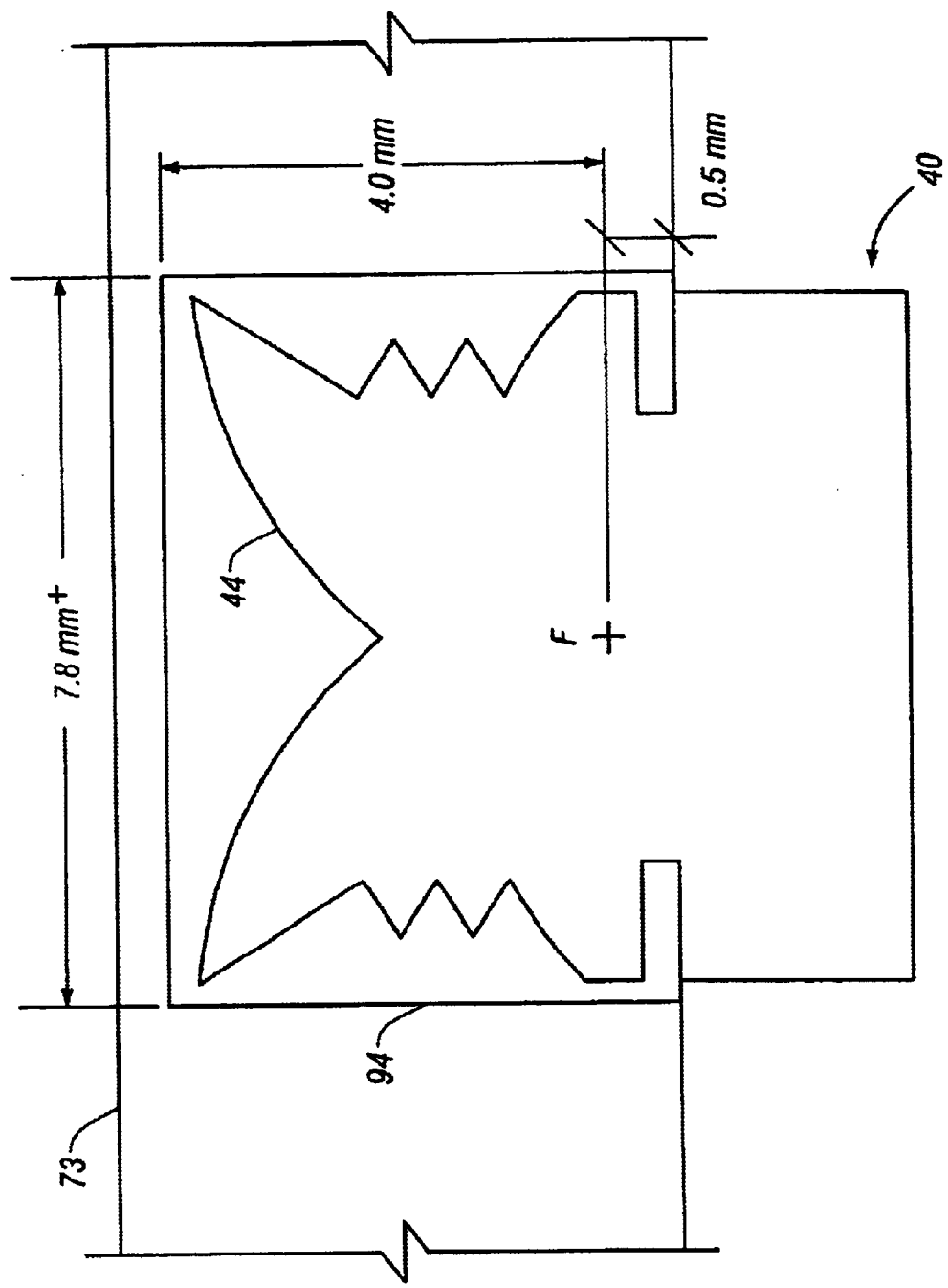
FIG. 7B illustrates a cross-sectional view of the LED package of FIG. 4 inserted into a blind hole in a light guide.
Figure 7C:
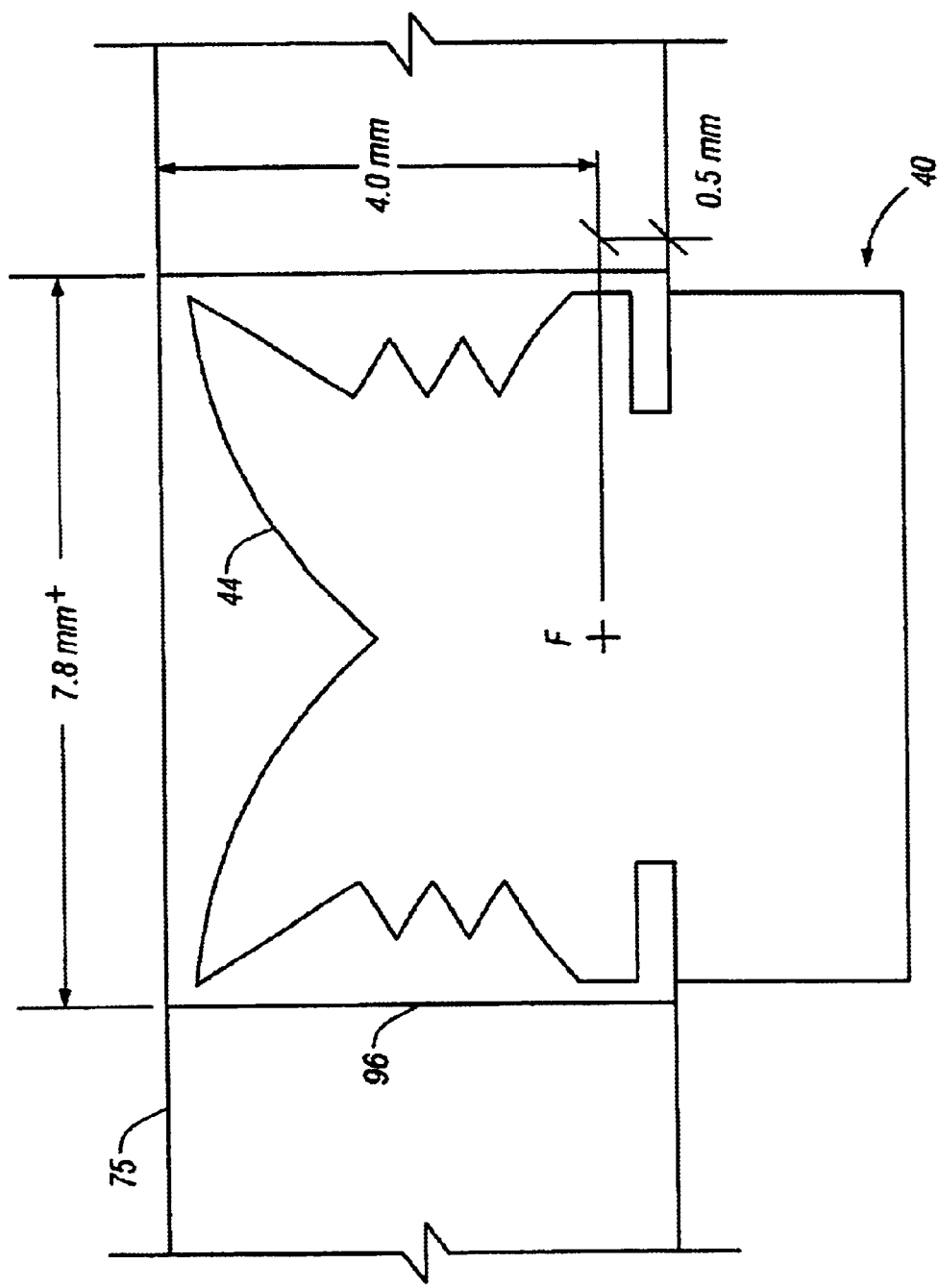
FIG. 7C illustrates a cross-sectional view of the LED package of FIG. 4 inserted into a through hole in a light guide.
Figure 7D:
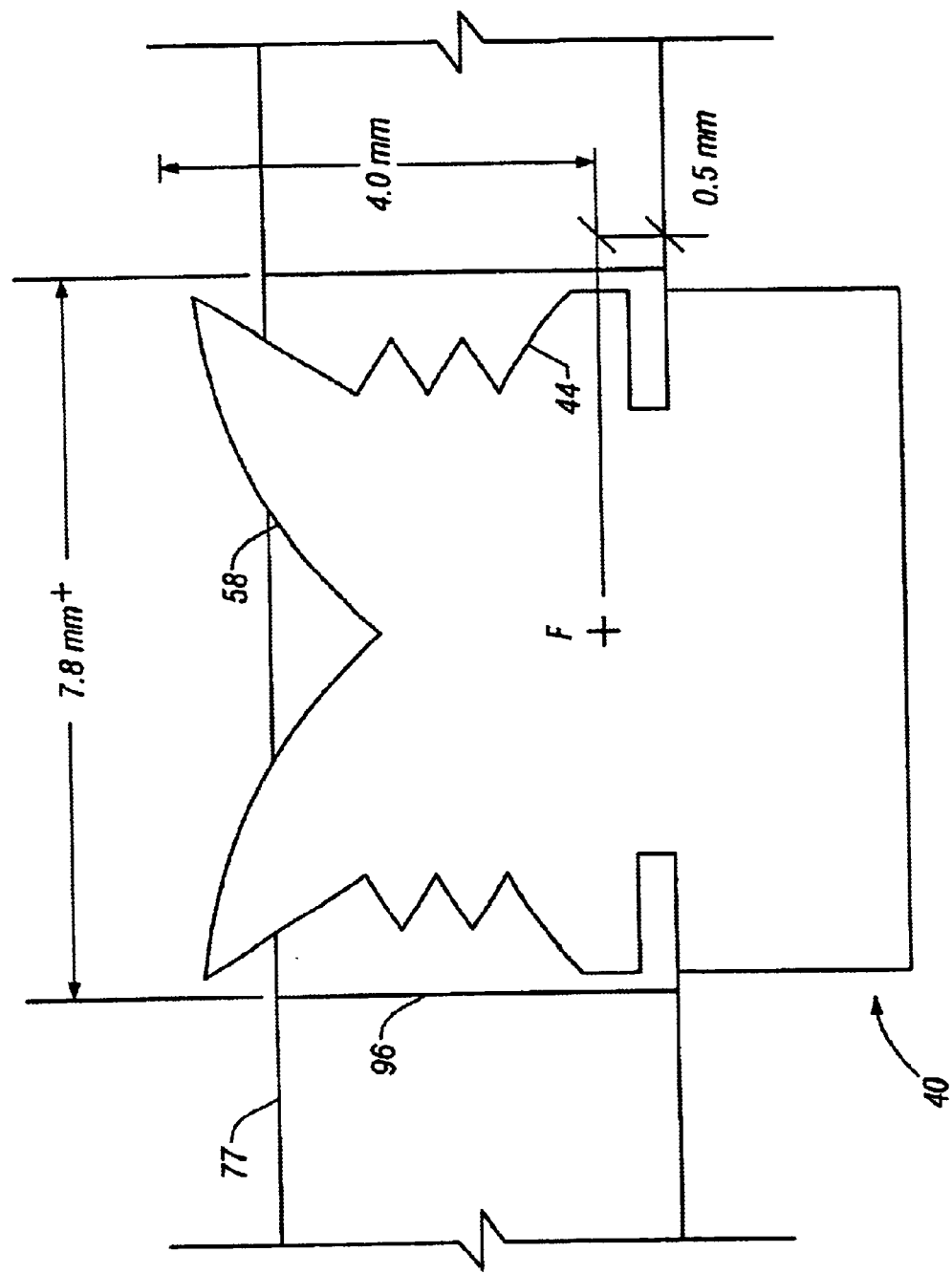
FIG. 7D illustrates a cross-sectional of the LED package of FIG. 4 inserted into a through hole in a light guide that is thinner than the height of the LED package.

The light guide can be made from optically transmissive materials, including but not limited to PC or PMMA. The light guide may be of constant thickness or tapered. Side emission of light allows efficient illumination of thin light guides with a thickness in the optimum range of 2 to 8 mm. FIG. 7B illustrates an example of a light guide 73 with a thickness of 5.0 mm which is greater than the height of lens 44. As the thickness of light guide 73 is greater than the height of the lens 44, a blind-hole 94 may be used in light guide 73 to allow coupling of the LED package 40. The dimensions of lenses 44 of FIGS. 7B, 7C & 7D are measured from the focal point F of lens 44. FIG. 7C illustrates an example of a light guide 75 with a thickness of 4.5 mm and equal to the height of lens 44. As the thickness of light guide 75 is equal to the height of lens 44, a through-hole 96 may be used in light guide 75 to allow coupling of LED package 40. FIG. 7D illustrates side-emission of light from the LED of FIG. 4 into a light guide 77 thinner than the height of lens 44. As the thickness of light guide 77 is less than the height of lens 44, a through-hole 96 must be used in the light guide 77 to allow coupling of LED package 40. Even though light guide 77 is thinner than the height of lens 44, a large portion of the light emitted from LED chip 52 will still be directed into light guide 77 as the bulk of the light emitted from LED chip 52 is emitted from the sides of lens 44. The large portion of the light emitted from lens 44 is targeted toward a light guide 77 that is positioned midway up the height of the lens. For example, the light emitted out the side of lens 44 near the top will be directed slightly downward and the light emitted out the side of lens 44 near the bottom will be directed slightly upward. The portion of light directed into light guide. 77 decreases as the thickness of light guide 77 relative to lens 44 decreases. Light guide 77 may be any shape including, without limitation, straight, tapered, rectangular, round or square.

It should be understood that the dimensions shown in FIGS. 7B–7D are meant to be illustrative but not limiting. In other implementations lenses and light guides may have dimensions either larger or smaller than those of the illustrated implementations.

Figure 8:
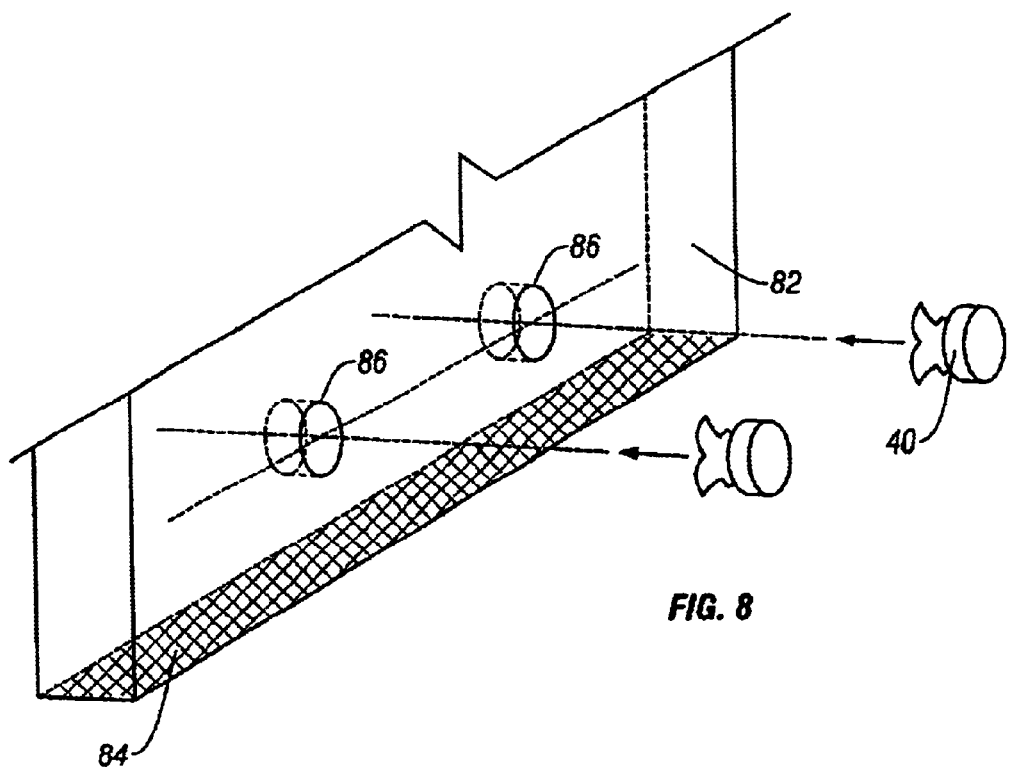
FIG. 8 illustrates a perspective view of a light guide.

FIG. 8 illustrates a perspective view of an end-portion of a planar light guide 82. The side emitting LED package 40 allows LED package 40 to be placed inside light guide 82. One or more holes 86 are made in the body of light guide 82 with a corresponding number of LED assemblies 40 placed within holes 86. Holes 86 may be made to any desired depth in light guide 82, including but not limited to the entire thickness of light guide 82. Lens 44 of LED package 40 may not touch light guide 82. A reflective coating or film 84 may be placed on at least one of the ends of light guide 82 to increase the internal illumination of light guide 82.

Figure 9A:
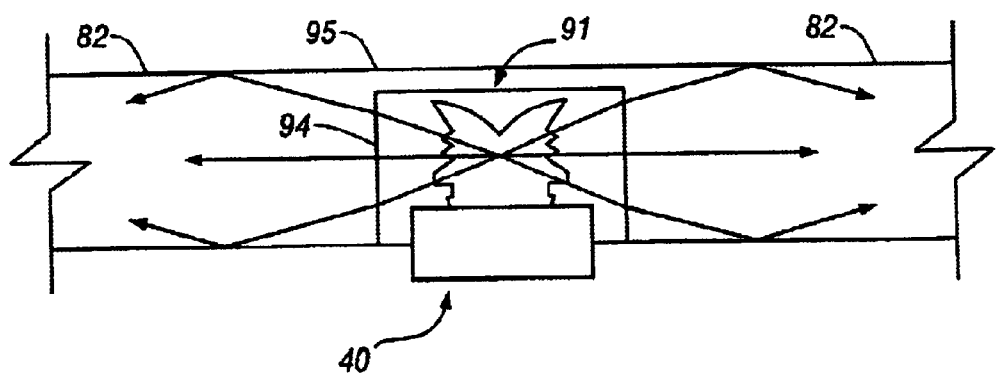
FIG. 9A illustrates a cross-sectional view of the LED package of FIG. 4 mounted in a blind-hole of a light guide.

FIG. 9A illustrates a side-emitting LED package 40 mounted in a blind-hole 94 of a planar light guide 82. Top surface 91 of blind-hole 94 is approximately parallel with top surface 95 of planar light guide 82. Top surface 91 of blind-hole 94 may be coated with a reflective coating or film to reflect light in order to allow for a thinner light guide package with a similar coupling efficiency.

Figure 9B:
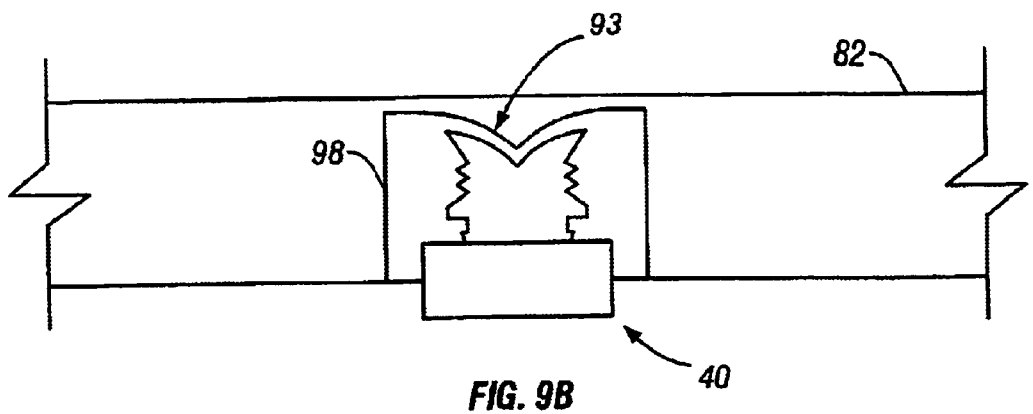
FIG. 9B illustrates a cross-sectional view of the LED package of FIG. 4 mounted in a blind-hole of a light guide.

FIG. 9B illustrates a side-emitting LED package 40 mounted in a funnel-shaped blind-hole 98 of a planar light guide 82. The top surface 93 of funnel-shaped blind-hole 98 is approximately parallel with funnel-shaped portion 58 of lens 44 of LED package 40. Top surface 93 of blind-hole 98 may be coated to reflect light in order to allow for a thinner light guide package with a similar coupling efficiency. The blind hole can have a flat, funnel or curved surface to assist with redirecting light emitted from the LED into the light guide.

Figure 9C:
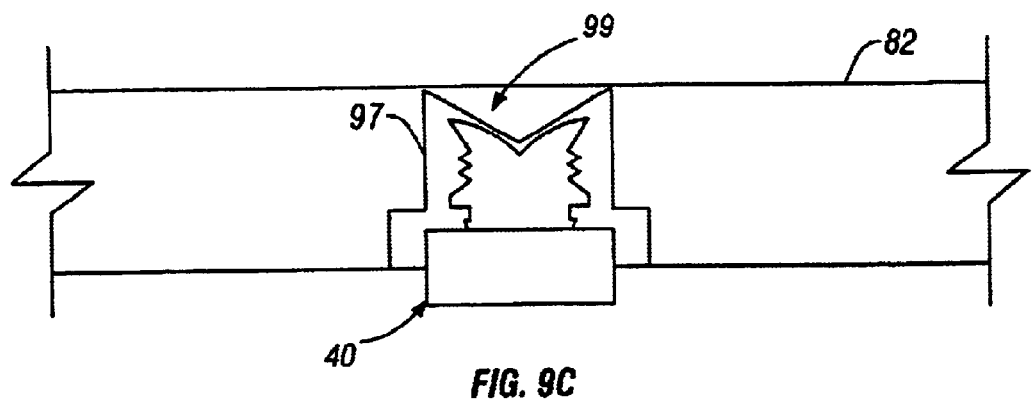
FIG. 9C illustrates a cross-sectional view of the LED package of FIG. 4 mounted in a blind-hole of a light guide.

FIG. 9C illustrates a side-emitting LED package 40 mounted in a v-shaped blind-hole 97 of a planar light guide 82. The v-shaped top surface 99 of the blind-hole 97 is approximately parallel with funnel-shaped portion 58 of lens 44 of LED package 40. The blind hole can have a flat, funnel or curved surface to assist with redirecting light emitted from the LED into the light guide. The top surface 99 of blind-hole 97 may be coated to reflect light in order to allow for a thinner light guide package with a similar coupling efficiency.

Figure 10:
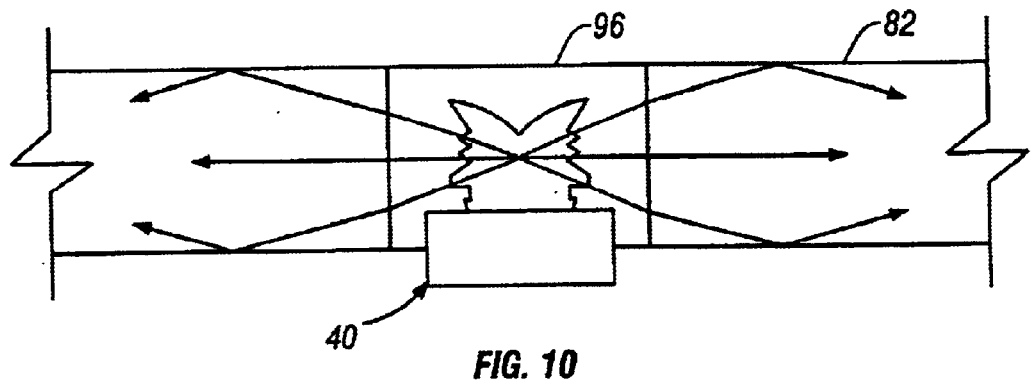
FIG. 10 illustrates a cross-sectional view of the LED package of FIG. 4 mounted in a through-hole of a light guide.

FIG. 10 illustrates a side-emitting LED package 40 mounted in a through-hole 96 of a planar light guide 82. Through-hole 96 allows LED package 40 to be mounted approximately perpendicular with light guide 82.

Figure 11:
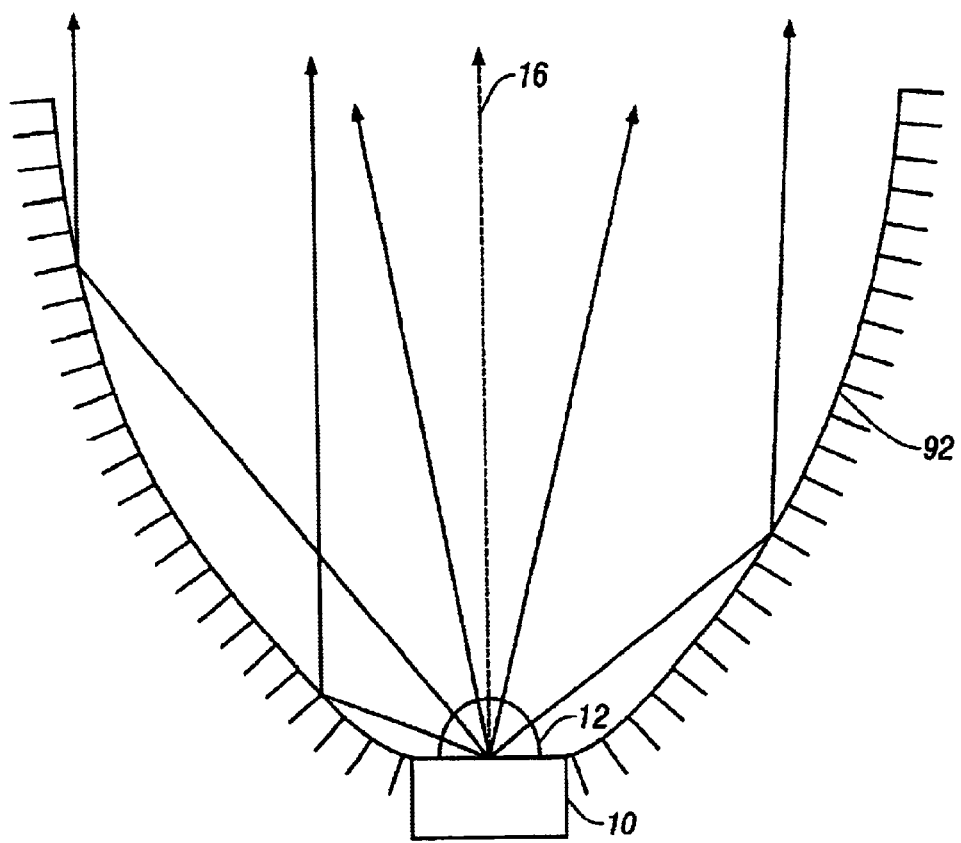
FIG. 11 illustrates a conventional LED package coupled to a reflector.

FIG. 11 illustrates a conventional LED/reflector arrangement. It is known to use an LED package 10 with a hemispherical lens 12 in combination with a deep reflector 92. The deep shape of the cavity of reflector 92 collimates light emitted from the hemispherical lens 12 of LED package 10. This deep reflector cavity is required to control the light.

Figure 12:
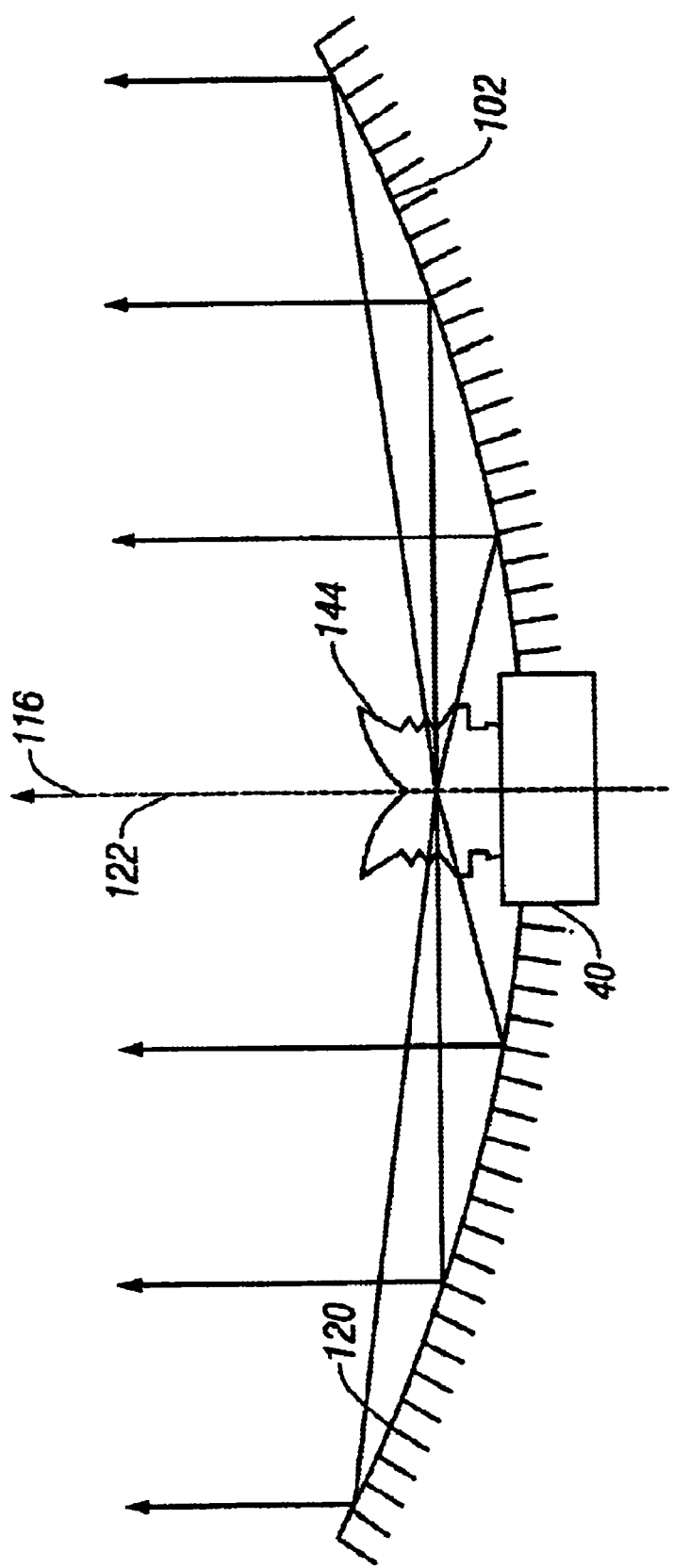
FIG. 12 illustrates the LED package of FIG. 4 in combination with a shallow reflector.

As seen in FIG. 12, a shallow, large-area reflector 102 can be used in combination with a side-emitting LED package 40 to emit light over a broader area than a conventional LED package 10. The longitudinal package axis 116 of the lens is approximately parallel to a radial axis 122 of reflector 102. The side-emission of light allows the walls of reflector 102 to be less deep than conventional reflectors 92 (FIG. 11). Light is emitted from lens 144 roughly perpendicular to longitudinal package axis 116 of LED package 40. Side-emitting LED package 40 allows for very high collection efficiencies with shallow large area reflectors compared to conventional LEDs. Shallow reflectors 102 collimate emitted light over a broader area than narrow, deep reflectors 92 used in combination with conventional LED assemblies 10. Shallow, large-area reflector 102 may be made of BMC bulk molding compound, PC, PMMA, PC/PMMA, and PEI. A reflective film 120 covering the inside of reflector 102 could be metallized, sputtered, or the like with highly reflective materials including, for example, aluminum (Al) and nickel chrome (NiCr). Side-emitting LEDs can achieve higher collection efficiencies with deep or shallow reflectors than the conventional LED/deep reflector combination.

Figure 13:
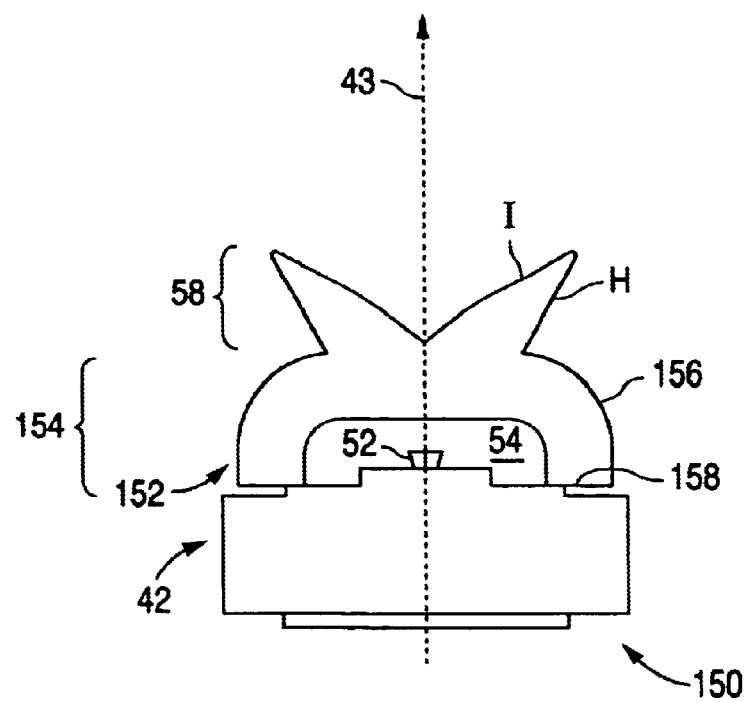
FIG. 13 illustrates a cross-sectional view of a light-emitting device in accordance with another embodiment.

Although the LED packages and light-emitting devices disclosed above include a lens 44 having several sawteeth, other embodiments may include a lens having only one sawtooth or no sawteeth. Referring to FIG. 13, for example, in accordance with one embodiment, a light-emitting device 150 includes a lens 152 similar to but differing from lens 44 disclosed above. In particular, lens 152 includes a funnel shaped portion 58 having a reflecting (e.g., totally internally reflecting) surface I and a refracting surface H, but does not include a refractive sawtooth portion such as sawtooth portion 56 of lens 44 (FIG. 5A). Instead, lower portion 154 of lens 152 has a refracting surface 156 extending as a smooth curve from refracting surface H to a bottom surface 158 of lens 152. If volume 54 is under vacuum or contains a gas, then bottom surface 158 of lens 152 may be considered to include the interface between volume 54 and the other portions of lens 152. Alternatively if volume 54 includes a non-gaseous material such as a solid, liquid, or gel, then bottom surface 158 may be considered to include the interface of such material with LED package base 42 and with LED 52.

Similarly to lens 44 disclosed above, lens 152 may be symmetrical (e.g., cylindrically symmetrical) about a central axis 43. Reflecting surface I of lens 152 may have shapes such as, for example, those described above and depicted in FIGS. 5E–5G for surface I of lens 44. Lens 152 may be formed from any of the materials and fabricated by any of the methods described above as suitable for fabrication of lens 44.

Figure 14:
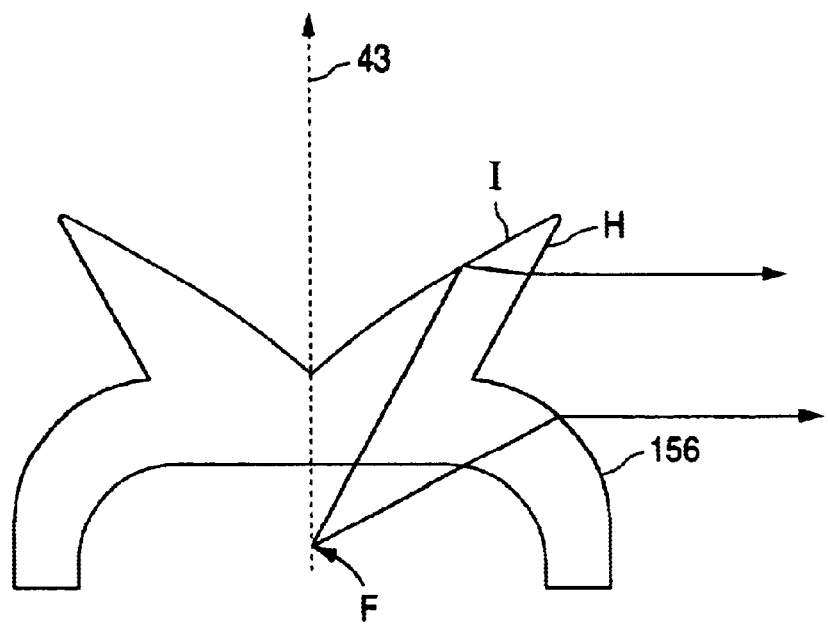
FIG. 14 illustrates ray traces through the lens illustrated in FIG. 13.

Referring now to the ray traces illustrated in FIG. 14 as well as to FIG. 13, light emitted by a light-emitting semiconductor device such as LED 52 located approximately at the focal point F of lens 152 may enter lens 152 through bottom surface 158 of the lens. Light emitted from near focal point F that is directly incident on reflecting surface I is reflected from surface I to refracting surface H and refracted by surface H to exit lens 152 in a direction substantially perpendicular to the central axis 43 of the lens. Light emitted from near focal point F that is directly incident on refracting surface 156 is refracted by surface 156 to also exit lens 152 in a direction substantially perpendicular to axis 43.

For convenience of illustration, the light rays illustrated in FIG. 13 and in the other figures are not shown as refracted at the interface of volume 54 with the other portions of lens 152. Generally, refraction of such light rays at this interface will occur due to a (typically small) difference in the refractive index between the material in volume 54 and the material of the other portions of the lens. The shapes of surfaces I, H, and 156 are typically chosen to take such refraction into account.

Figure 15:
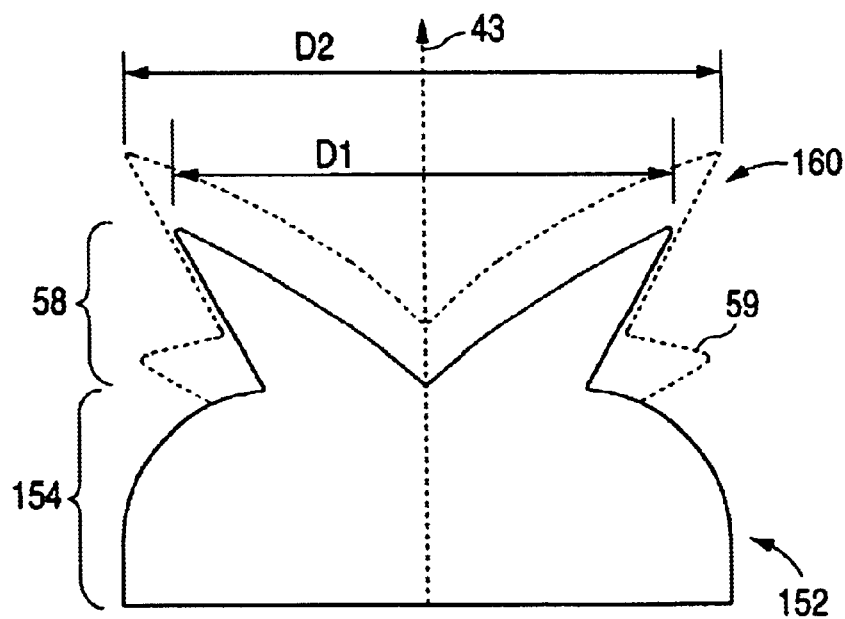
FIG. 15 illustrates a cross-sectional view of the lens illustrated in FIG. 13 superimposed over a cross-sectional view of a lens in accordance with another embodiment.

FIG. 15 illustrates a cross-sectional view of lens 152 superimposed over a cross-sectional view of a lens 160 (dashed line) that includes a single refractive sawtooth. Aside from having only a single refractive sawtooth, lens 160 is substantially similar in structure and function to lens 44 disclosed above. The implementations of lens 152 and 160 shown in FIG. 15 are optimized for use with substantially similar LEDs in substantially similar packages. Hence, the lowermost portions of lens 152 and lens 160 are substantially identical in size and shape.

As FIG. 15 shows, the diameter D1 of the funnel shaped portion 58 of lens 152 is substantially less than the diameter D2 of its lower portion 154. In contrast, the diameter of the funnel shaped portion of lens 160 is approximately equal to the diameter of its lowermost portion. In some implementations, the relatively smaller diameter of the funnel shaped portion 58 of lens 152 makes lens 152 easier and less expensive than lens 160 (or other lenses including refractive sawteeth) to manufacture, to insert into and to attach to an LED package, and to fill with, for example, silicone or resin.

Light-emitting device 150 may be employed with, for example, light guides and shallow, large-area reflectors similarly as disclosed above for other LED packages and light-emitting devices.

Figure 16:
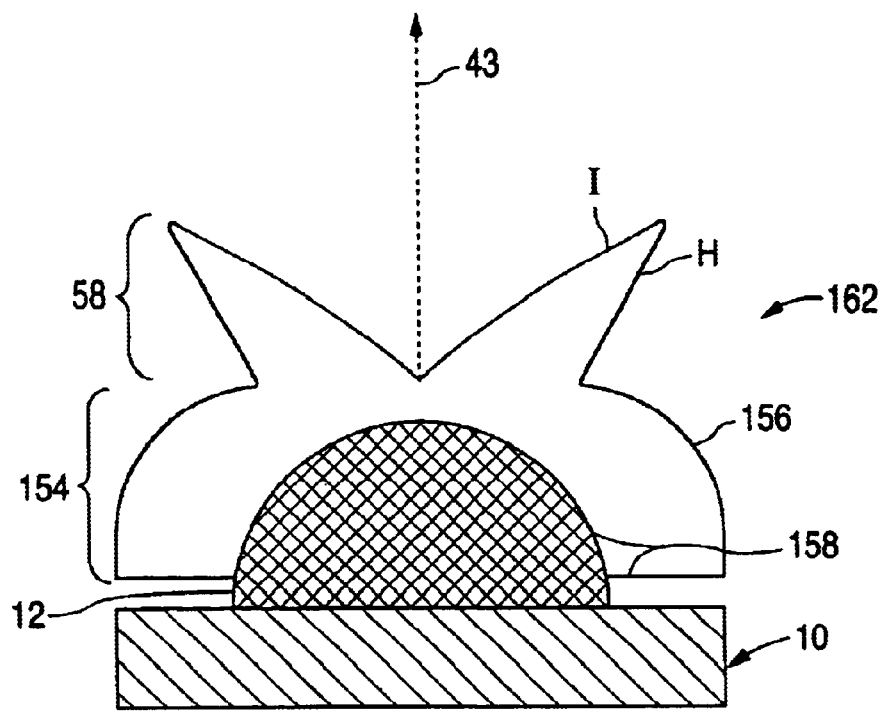
FIG. 16 illustrates a cross-sectional view of a lens cap mating to an LED package in accordance with another embodiment.

In another embodiment (FIG. 16), a lens cap 162 mates to a conventional LED. package 10 having a hemispherical lens 12. Lens cap 162 may be attached to lens 12 by an optical adhesive, for example. Lens cap 162 includes a funnel shaped portion 58 having a reflecting (e.g., totally internally reflecting) surface I and a refracting surface H, as well as a lower portion 154 having a refracting surface 156 extending as a smooth curve from refracting surface H to a bottom surface 158. Lens cap 162 may have the shapes and symmetries disclosed above for lens 152, and may be formed from any of the materials and by any of the methods described above as suitable for fabrication of lenses 44 and 152. As described above with respect to lens 152, light emitted by LED package 10 is directed by surfaces I, H, and 156 of lens cap 162 in a direction substantially perpendicular to a central axis 43 of the lens cap.

The above-described embodiments of the present invention are meant to be illustrative and not limiting. It will thus be obvious to those skilled in the art that various changes and modifications may be made without departing from this invention in its broader aspects. Therefore, the appended claims encompass all such changes and modifications as falling within the true spirit and scope of this invention.

We claim:

1. A lens comprising:
   a bottom surface;
   a reflecting surface;
   a first refracting surface obliquely angled with respect to a central axis of the lens; and
   a second refracting surface extending as a smooth curve from the bottom surface to the first refracting surface;
   wherein light entering the lens through the bottom surface and directly incident on the reflecting surface is reflected from the reflecting surface to the first refracting surface and refracted by the first refracting surface to exit the lens in a direction substantially perpendicular to the central axis of the lens, and
   wherein light entering the lens through the bottom surface and directly incident on the second refracting surface is refracted by the second refracting surface to exit the lens in a direction substantially perpendicular to the central axis of the lens.

2. The lens of claim 1, wherein at least a portion of the bottom surface is perpendicular to the central axis.

3. The lens of claim 1, wherein the reflecting surface reflects by total internal reflection.

4. The lens of claim 1, wherein the reflecting surface is a surface of a funnel-shaped portion of the lens.

5. The lens of claim 1, wherein the reflecting surface, the first refracting surface, and the second refracting surface are each portions of surfaces having cylindrical symmetry about the central axis.

6. A light-emitting device comprising:
   a light-emitting semiconductor device; and
   a lens comprising:
      a bottom surface;
      a reflecting surface;
      a first refracting surface obliquely angled with respect to a central axis of the lens; and
      a second refracting surface extending as a smooth curve from the bottom surface to the first refracting surface;
   wherein light emitted by the semiconductor device, entering the lens through the bottom surface, and directly incident on the reflecting surface is reflected from the reflecting surface to the first refracting surface and refracted by the first refracting surface to exit the lens in a direction substantially perpendicular to the central axis of the lens, and
   wherein light emitted by the semiconductor device, entering the lens through the bottom surface, and directly incident on the second refracting surface is refracted by the second refracting surface to exit the lens in a direction substantially perpendicular to the central axis of the lens.

7. The light-emitting device of claim 6, wherein at least a portion of the bottom surface of the lens is perpendicular to the central axis.

8. The light-emitting device of claim 6, wherein the reflecting surface reflects by total internal reflection.

9. The light-emitting device of claim 6, wherein the reflecting surface is a surface of a funnel-shaped portion of the lens.

10. The light-emitting device of claim 6, wherein the reflecting surface, the first refracting surface, and the second refracting surface of the lens are each portions of surfaces having cylindrical symmetry about the central axis.

11. A lens cap comprising:
    a bottom surface attachable to a lens;
    a reflecting surface;
    a first refracting surface obliquely angled with respect to a central axis of the lens cap; and
    a second refracting surface extending as a smooth curve from the bottom surface to the first refracting surface;
    wherein light entering the lens cap through the bottom surface and directly incident on the reflecting surface is reflected from the reflecting surface to the first refracting surface and refracted by the first refracting surface to exit the lens cap in a direction substantially perpendicular to the central axis of the lens, and
    wherein light entering the lens cap through the bottom surface and directly incident on the second refracting surface is refracted by the second refracting surface to exit the lens cap in a direction substantially perpendicular to the central axis of the lens cap.

12. The lens cap of claim 11, wherein at least a portion of the bottom surface is perpendicular to the central axis.

13. The lens cap of claim 11, wherein the reflecting surface reflects by total internal reflection.

14. The lens cap of claim 11, wherein the reflecting surface is a surface of a funnel-shaped portion of the lens cap.

15. The lens cap of claim 11, wherein the reflecting surface, the first refracting surface, and the second refracting surface are each portions of surfaces having cylindrical symmetry about the central axis.

* * * * *